US011390566B2

(12) United States Patent
Seol

(10) Patent No.: US 11,390,566 B2
(45) Date of Patent: Jul. 19, 2022

(54) BONDED CERAMIC AND MANUFACTURING METHOD THEREFOR

(71) Applicant: TOKAI CARBON KOREA CO., LTD, Gyeonggi-do (KR)

(72) Inventor: Chang Wook Seol, Gyeonggi-do (KR)

(73) Assignee: TOKAI CARBON KOREA CO., LTD, Gyeonggi-do (KR)

( * ) Notice: Subject to any disclaimer, the term of this patent is extended or adjusted under 35 U.S.C. 154(b) by 0 days.

(21) Appl. No.: 16/956,190

(22) PCT Filed: Nov. 23, 2018

(86) PCT No.: PCT/KR2018/014501
§ 371 (c)(1),
(2) Date: Jun. 19, 2020

(87) PCT Pub. No.: WO2019/124778
PCT Pub. Date: Jun. 27, 2019

(65) Prior Publication Data
US 2020/0331812 A1    Oct. 22, 2020

(30) Foreign Application Priority Data

Dec. 19, 2017  (KR) .................. 10-2017-0175077

(51) Int. Cl.
*C04B 37/00*  (2006.01)
*B32B 18/00*  (2006.01)
(Continued)

(52) U.S. Cl.
CPC ............ *C04B 37/001* (2013.01); *B32B 18/00* (2013.01); *B32B 38/0012* (2013.01);
(Continued)

(58) Field of Classification Search
CPC .................................................. C04B 37/001
See application file for complete search history.

(56) References Cited

U.S. PATENT DOCUMENTS

2004/0094871 A1    5/2004  Ito et al.
2004/0175549 A1*   9/2004  Ito ....................... C04B 35/5622
                                                         428/209
(Continued)

FOREIGN PATENT DOCUMENTS

EP       1642876 A1 *  4/2006  .......... C04B 35/581
JP       2001261458 A   9/2001
(Continued)

OTHER PUBLICATIONS

English Translation of International Search Report for International Patent Application No. PCT/KR2018/014501, dated Apr. 26, 2019, 2 pages.

*Primary Examiner* — David Sample
(74) *Attorney, Agent, or Firm* — Armstrong Teasdale LLP

(57) ABSTRACT

Described herein are a bonded ceramic and a manufacturing method therefor. The bonded ceramic includes: a first ceramic substrate; and a second ceramic substrate, wherein the first ceramic substrate and the second ceramic substrate are bonded to each other without an adhesive layer therebetween and include pores, each of which is formed along a bonded surface therebetween and has a size of 0.01 to 50 μm.

8 Claims, 1 Drawing Sheet

(51) Int. Cl.
 *B32B 38/00* (2006.01)
 *H01L 21/683* (2006.01)
 *B32B 37/00* (2006.01)

(52) U.S. Cl.
 CPC .. *H01L 21/6838* (2013.01); *B32B 2037/0092* (2013.01); *B32B 2457/14* (2013.01); *B32B 2605/006* (2013.01); *C04B 2237/365* (2013.01); *C04B 2237/52* (2013.01); *C04B 2237/704* (2013.01)

(56) References Cited

U.S. PATENT DOCUMENTS

| | | | |
|---|---|---|---|
| 2007/0235122 | A1 | 10/2007 | Meschke et al. |
| 2008/0096758 | A1* | 4/2008 | Unno ............... C04B 37/001 501/141 |
| 2014/0326403 | A1* | 11/2014 | Chand ............... C04B 35/571 156/281 |
| 2017/0226019 | A1* | 8/2017 | Schnetter .......... C04B 37/006 |
| 2018/0257997 | A1* | 9/2018 | Kim .................. C04B 35/565 |

FOREIGN PATENT DOCUMENTS

| | | |
|---|---|---|
| JP | 2006083057 A | 3/2006 |
| JP | 2015224152 A | 12/2015 |
| JP | 2016069207 A | 5/2016 |
| KR | 20030007929 A | 1/2003 |
| KR | 20170021255 A | 2/2017 |

\* cited by examiner

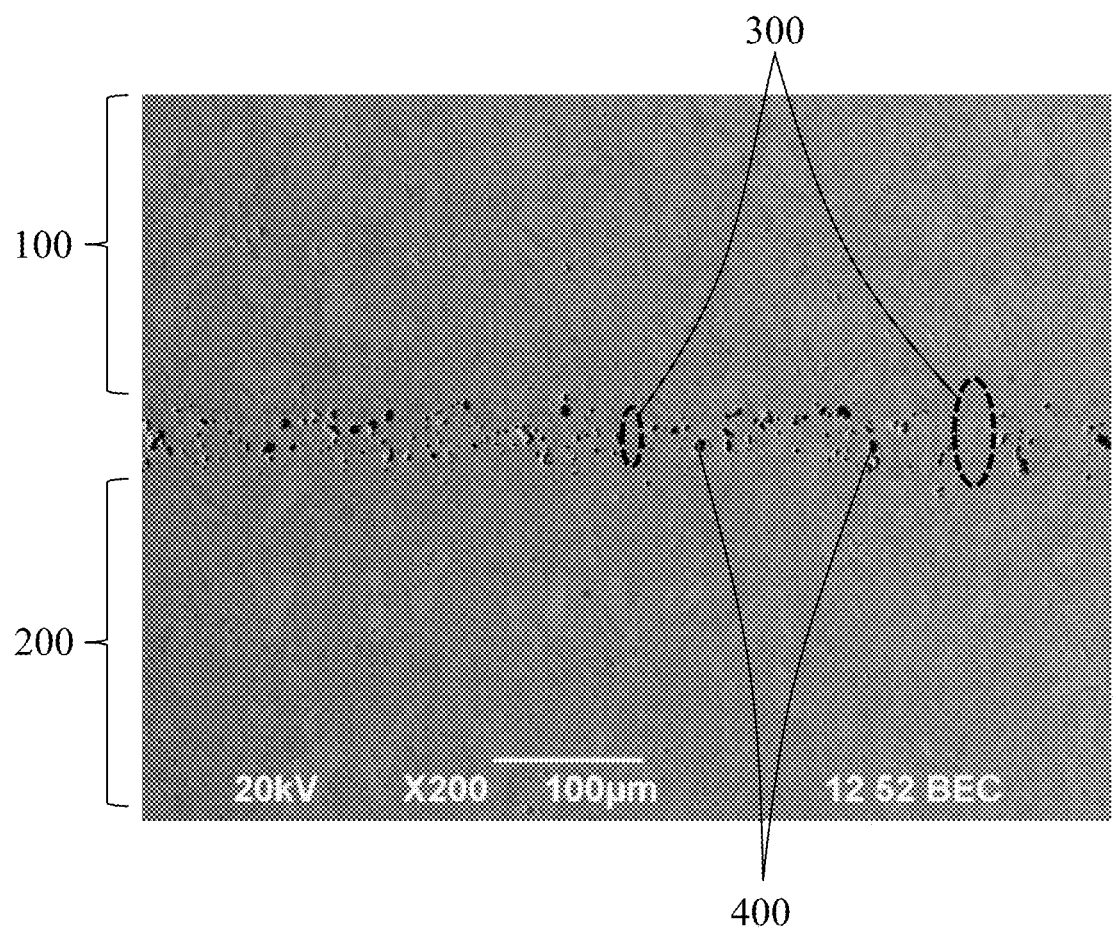

BONDED CERAMIC AND MANUFACTURING METHOD THEREFOR

CROSS-REFERENCE TO RELATED APPLICATIONS

This application is a National Phase Application of PCT International Application No. PCT/KR2018/014501, having an International Filing Date of Nov. 23, 2018, which claims priority to Korean Patent Application No. 10-2017-0175077, filed Dec. 19, 2017, each of which is hereby incorporated by reference in its entirety.

TECHNICAL FIELD

The present invention relates to a bonded ceramic and a manufacturing method therefor, and more specifically, to bonded ceramics bonded in an adhesive layer-free manner and a manufacturing method therefor.

BACKGROUND ART

In electronic components, biomaterials, heat-resistant/wear-resistant structural components, and the like, various types of ceramic materials are being used in various fields. Ceramic materials are utilized through bonding between ceramic materials and bonding between ceramic materials and metal materials, except that ceramic materials are used alone. Bonding between ceramic materials and bonding between ceramic materials and metal materials are generally performed by an adhesive made of an epoxy resin, and the like.

An adhesive strength of the epoxy resin is reduced by half or less at a temperature condition of 80° C. in comparison to a temperature condition of 25° C. Thus, it is difficult to use an existing ceramic bonding in a high-temperature environment. Also, due to a low bonding strength, it is difficult to use the existing ceramic bonding in an application field that requires a high strength in the high-temperature environment.

DISCLOSURE OF THE INVENTION

Technical Subject

One or more example embodiments of the present invention are to solve the above-mentioned problems, and an aspect of the present invention provides a bonded ceramic having a high strength in a high-temperature environment without a separate adhesive layer, and a manufacturing method therefor.

However, problems to be solved by the present invention are not limited to the above-described problems, and other problems not mentioned herein may be clearly understood by those skilled in the art from the following description.

Technical Solution

According to an example embodiment of the present invention, there is provided a bonded ceramic including: a first ceramic substrate; and a second ceramic substrate, wherein the first ceramic substrate and the second ceramic substrate are bonded in an adhesive layer-free manner, and wherein the first ceramic substrate and the second ceramic substrate include pores that are formed along a bonded surface between the first ceramic substrate and the second ceramic substrate and that each have a size of 0.01 µm to 50 µm.

According to an aspect, a grain located on both the first ceramic substrate and the second ceramic substrate may be included.

According to an aspect, a grain located on both the first ceramic substrate and the second ceramic substrate may have a size of 0.1 µm to 100 µm.

According to an aspect, the first ceramic substrate and the second ceramic substrate may each include at least one selected from the group consisting of silicon carbide (SiC), silicon nitride (SiN4), alumina (Al2O3), aluminum nitride (AlN), zirconium oxide (ZrO2), silicon oxide (SiO2), zirconia toughened alumina (ZTA), magnesium oxide (MgO), cordierite, mullite, and cordierite.

According to an aspect, the first ceramic substrate and the second ceramic substrate may be a same material and may be free of heterogeneous materials.

According to an aspect, the bonded ceramic may further include a plurality of ceramic substrates, wherein the plurality of ceramic substrates are laminated and bonded onto the first ceramic substrate or the second ceramic substrate in an adhesive layer-free manner.

According to an aspect, the first ceramic substrate and the second ceramic substrate may each have a thickness of 1 mm to 100 mm.

According to an aspect, the bonded ceramic may have a total thickness of 2 mm to 200 mm.

According to an aspect, the bonded ceramic may have a strength of 70% or greater in comparison to a single bulk ceramic substrate.

According to an example embodiment of the present invention, there is provided a method of manufacturing a bonded ceramic, the method including: polishing one surface of a first ceramic substrate and one surface of a second ceramic substrate; and bonding the polished surface of the first ceramic substrate and the polished surface of the second ceramic substrate to be in contact with each other.

According to an aspect, in the bonding, a grain located on both the first ceramic substrate and the second ceramic substrate may be formed.

According to an aspect, a grain formed on both the first ceramic substrate and the second ceramic substrate may have a size of 0.1 µm to 100 µm.

According to an aspect, the bonding may be performed within an overlapping temperature range between a temperature range of 60% to 90% of a melting temperature of the first ceramic substrate and a temperature range of 60% to 90% of a melting temperature of the second ceramic substrate. The bonding may be performed under a pressure condition of 0.1 kg/cm² to 100 kg/cm².

According to an example embodiment of the present invention, there is provided an application with a bonded ceramic, wherein the bonded ceramic is applied to at least one selected from the group consisting of a reflector and a viewing window of an aerospace industry, and a vacuum chuck for fixing a wafer of a semiconductor industry.

Effect of the Invention

A bonded ceramic according to the present invention may be bonded by a growth of a grain of a material itself, instead of using a bonding material, and thus may be excellent in a strength, may be used in a high-temperature environment, and may be applied to at least one selected from the group consisting of a reflector and a viewing window of an aerospace industry, and a vacuum chuck for fixing a wafer of a semiconductor industry.

BRIEF DESCRIPTION OF THE DRAWINGS

FIG. 1 is a scanning electron microscope (SEM) image of a bonded surface of a bonded ceramic according to an example embodiment of the present invention.

BEST MODE FOR CARRYING OUT THE INVENTION

Hereinafter, example embodiments of the present invention will be described in detail with reference to the accompanying drawings. When it is determined detailed description related to a related known function or configuration they may make the purpose of the present invention unnecessarily ambiguous in describing the present invention, the detailed description will be omitted here. Also, terminologies used herein are defined to appropriately describe the example embodiments and thus may be changed depending on a user, the intent of an operator, or a custom of a field to which the present invention pertains. Accordingly, the terminologies must be defined based on the following overall description of the present specification. The same reference numerals as shown in each drawing represent same elements.

Throughout the specification, when any element is positioned "on" the other element, this not only includes a case that the any element is brought into contact with the other element, but also includes a case that another element exists between two elements.

Throughout the specification, if a prescribed part "includes" a prescribed element, this means that another element can be further included instead of excluding other elements unless any particularly opposite description exists.

Hereinafter, a bonded ceramic and a method of manufacturing the bonded ceramic will be described in detail with reference to example embodiments and drawings. However, the present invention is not limited to the example embodiments and drawings.

A bonded ceramic according to an example embodiment of the present invention may include a first ceramic substrate; and a second ceramic substrate, and the first ceramic substrate and the second ceramic substrate may be bonded in an adhesive layer-free manner and may include pores that are formed along a bonded surface between the first ceramic substrate and the second ceramic substrate and that each have a size of 0.01 μm to 50 μm.

In the bonded ceramic according to an example embodiment of the present invention, a bonding boundary line (boundary layer) is not observed on the bonded surface, and only pores formed along the bonded surface are included.

According to an aspect, a grain located on both the first ceramic substrate and the second ceramic substrate may be included.

The bonded ceramic according to the present invention may be an adhesive layer-free bonded ceramic without using a bonding material, and a grain located on both two ceramic substrates may be formed by a grain growth of a ceramic material itself. Thus, the bonded ceramic according to the present invention may be excellent in a strength and may be used in a high-temperature environment.

According to an aspect, a grain located on both the first ceramic substrate and the second ceramic substrate may have a size of 0.1 μm to 100 μm.

Before the first ceramic substrate and the second ceramic substrate are bonded, a grain may be formed on a bonding surface of each of the first ceramic substrate and the second ceramic substrate. When the grain of the bonding surface of each of the first ceramic substrate and the second ceramic substrate is extremely small or large in size, a grain located on both the above two ceramic substrates may not be formed. Thus, a grain finally formed on both the first ceramic substrate and the second ceramic substrate may desirably have a size of 0.1 μm to 100 μm.

According to an aspect, the first ceramic substrate and the second ceramic substrate may each include at least one selected from the group consisting of silicon carbide (SiC), silicon nitride (SiN4), alumina (Al2O3), aluminum nitride (AlN), zirconium oxide (ZrO2), silicon oxide (SiO2), zirconia toughened alumina (ZTA), magnesium oxide (MgO), cordierite, mullite, and cordierite. However, there is no limitation thereto.

According to an aspect, the first ceramic substrate and the second ceramic substrate may be a same material and may be free of heterogeneous materials. In other words, when an instrumental analysis of a bonded ceramic material according to an example embodiment of the present invention without using a heterogeneous material is performed, a heterogeneous material may not be detected.

According to an aspect, the bonded ceramic may further include a plurality of ceramic substrates, and the plurality of ceramic substrates may be laminated and bonded onto the first ceramic substrate or the second ceramic substrate in an adhesive layer-free manner.

The above lamination may be performed by a growth of a grain similarly to the above description, and grains of the plurality of ceramic substrates may be bonded by grains located on each of boundary surfaces therebetween.

According to an aspect, the first ceramic substrate and the second ceramic substrate may each have a thickness of 1 mm to 100 mm.

According to an aspect, the bonded ceramic may have a total thickness of 2 mm to 200 mm.

According to an aspect, the bonded ceramic may have a strength of 70% or greater in comparison to a single bulk ceramic substrate.

A ceramic substrate may have an optimum thickness based on a type, and when a ceramic substrate is thin or thick, a strength of the ceramic substrate may be greatly reduced, and accordingly a problem of being easily broken may occur. However, the total thickness of the bonded ceramic according to the present invention may be freely adjusted by bonding the plurality of ceramic substrates without a bonding layer, and the bonded ceramic may have a strength of 70% or greater in comparison to a single bulk ceramic substrate.

A method of manufacturing a bonded ceramic according to an example embodiment of the present invention may include polishing one surface of a first ceramic substrate and one surface of a second ceramic substrate; and bonding the polished surface of the first ceramic substrate and the polished surface of the second ceramic substrate to be in contact with each other.

According to an aspect, in the bonding, a grain located on both the first ceramic substrate and the second ceramic substrate may be formed.

According to an aspect, the grain located on both the first ceramic substrate and the second ceramic substrate may have a size of 0.1 μm to 100 μm.

The method of manufacturing the bonded ceramic according to the present invention may be a method of manufacturing an adhesive layer-free bonded ceramic without using a bonding material. More specifically, through a scheme of polishing a grain located on one surface of each ceramic material as smooth as possible and of bonding polished surfaces, a grain located on both the two ceramic substrates by a growth of polished grains of the two ceramic substrates may be formed. Thus, it is possible to implement a bonded ceramic that has an excellent strength and that may be used in a high-temperature environment.

According to an aspect, the bonding may be performed within an overlapping temperature range between a temperature range of 60% to 90% of a melting temperature of the first ceramic substrate and a temperature range of 60% to 90% of a melting temperature of the second ceramic substrate, The bonding may be performed under a pressure condition of 0.1 kg/cm$^2$ to 100 kg/cm$^2$.

A selection of a temperature may be proportional to a melting temperature of each material, and 60% to 90% of the melting temperature may be suitable. When the bonding is performed under a temperature condition exceeding 90% of the melting temperature, a severe deformation or melting of a material may occur. When the bonding is performed under a temperature condition less than 60%, the first ceramic substrate and the second ceramic substrate may not be bonded due to an insufficient diffusion.

In an example, when the melting temperature of the first ceramic substrate is 100° C. and when the melting temperature of the second ceramic substrate is 120° C., the bonding may be performed within a temperature range of 72° C. to 90° C.

In another example, when the first ceramic substrate and the second ceramic substrate are silicon carbide, the bonding may be performed within a temperature range of 700° C. to 2500° C. and more desirably a temperature range of 1700° C. to 2300° C.

When the bonding is performed under a condition of a load exceeding 100 kg/cm$^2$, a severe deformation of a material may occur. Under a condition of a load less than 0.1 kg/cm2, the first ceramic substrate and the second ceramic substrate may not be bonded due to an insufficient diffusion.

The bonded ceramic according to an example embodiment of the present invention or a bonded ceramic manufactured by the method according to an example embodiment of the present invention may be applied to at least one selected from the group consisting of a reflector and a viewing window of an aerospace industry, and a vacuum chuck for fixing a wafer of a semiconductor industry.

In particular, as a reflector of the aerospace industry, the bonded ceramic according to the present invention may be used. A strength of a ceramic substrate applied to an application used in the aerospace industry may need to be maintained in a harsh environmental condition. As described above, the bonded ceramic according to the present invention is a bonded ceramic in which bonding is performed by a grain growth of a material itself, instead of using a bonding material, and thus the bonded ceramic may be excellent in the strength and may be used in a high-temperature environment. In other words, the bonded ceramic may be used as a reflector of the aerospace industry.

Hereinafter, the present invention will be described in more detail with reference to an example and a comparative example.

However, the following example is given to illustrate the present invention, and the present invention is not limited to the example.

EXAMPLE

Bonding surfaces of two silicon carbide substrates with a grain having a size of about 10 μm and a thickness of 2 mm were polished, and the two silicon carbide substrates were laminated so that the polished surfaces face each other, and maintained for 10 hours at 2000° C. and 10 kg/cm$^2$.

Comparative Example

Bonding surfaces of two silicon carbide substrates with a grain having a size of about 3 μm and a thickness of 2 mm were polished, and the two silicon carbide substrates were laminated so that the polished surfaces face each other, and maintained for 10 hours at 2000° C. and 10 kg/cm$^2$.

FIG. 1 is a scanning electron microscope (SEM) image of a bonded surface of a bonded ceramic according to an example embodiment of the present invention.

Referring to FIG. 1, it may be found that a bonded ceramic manufactured according to the example includes a grain 300 formed on both a first silicon carbide substrate 100 and a second silicon carbide substrate 200. Also, it may be found that a bonding boundary line (boundary layer) is not observed and that pores 400 are observed on the bonded surface of the bonded ceramic. This indicates that the first silicon carbide substrate 100 and the second silicon carbide substrate 200 are bonded without using an adhesive material.

On the other hand, it is confirmed that a bonded ceramic manufactured according to the comparative example was not bonded at all. This indicates that a diffusion was not performed due to an extremely large grain.

Table 1 shows a strength of the bonded ceramic according to an example embodiment of the present invention and a strength of a single bulk silicon carbide substrate that is not bonded.

TABLE 1

| No. | Bulk material (MPa) | Bonding material (MPa) |
|---|---|---|
| 1 | 366 | 330 |
| 2 | 369 | 339 |
| 3 | 375 | 331 |
| 4 | 365 | 328 |
| 5 | 373 | 335 |
| Average | 367 | 332 |

Referring to Table 1, it may be found that a bonding material that bonds silicon carbide substrates according to an example embedment of the present invention has a strength of 70% or greater in comparison to a single bulk ceramic substrate.

Also, when a bonded ceramic according to an example embedment of the present invention is analyzed through an energy dispersive X-ray spectroscopy (EDS), it is confirmed that there were no heterogeneous materials other than silicon (Si) and carbon (C) on a bonded surface that is a selection region, which indicates that two silicon carbide substrates were bonded without an adhesive.

While a few example embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements are combined or coupled in different forms and modes than as described above or be substituted or switched with other components or equivalents. Thus, other implementations, alternative embodiments and equivalents to the claimed subject matter are construed as being within the appended claims.

The invention claimed is:

1. A bonded ceramic comprising:
    a first ceramic substrate; and
    a second ceramic substrate,
    wherein the first ceramic substrate and the second ceramic substrate are bonded in an adhesive layer-free manner,
    wherein the first ceramic substrate and the second ceramic substrate comprise pores that are formed along a bonded surface between the first ceramic substrate and the second ceramic substrate and that each have a size of 0.01 μm to 50 μm;
    wherein the first ceramic substrate and the second ceramic substrate each have a thickness of greater than or equal to 1 mm and less than 10 mm; and
    wherein the bonded ceramic has a strength of 80% or greater in comparison to a single bulk ceramic substrate.

2. The bonded ceramic of claim 1, wherein a grain located on both the first ceramic substrate and the second ceramic substrate is included.

3. The bonded ceramic of claim 1, wherein a grain located on both the first ceramic substrate and the second ceramic substrate has a size of 0.1 μm to 100 μm.

4. The bonded ceramic of claim 1, wherein the first ceramic substrate and the second ceramic substrate each comprise at least one selected from the group consisting of silicon carbide (SiC), silicon nitride (SiN4), alumina (Al2O3), aluminum nitride (AlN), zirconium oxide (ZrO2), silicon oxide (SiO2), zirconia toughened alumina (ZTA), magnesium oxide (MgO), cordierite, mullite, and cordierite.

5. The bonded ceramic of claim 1, wherein the first ceramic substrate and the second ceramic substrate are a same material and are free of heterogeneous materials.

6. The bonded ceramic of claim 1, further comprising:
    a plurality of ceramic substrates,
    wherein the plurality of ceramic substrates are laminated and bonded onto the first ceramic substrate or the second ceramic substrate in an adhesive layer-free manner.

7. The bonded ceramic of claim 1, wherein the bonded ceramic has a total thickness of 2 mm to 200 mm.

8. An article with a bonded ceramic, comprising the bonded ceramic of claim 1 applied to at least one selected from the group consisting of a reflector and a viewing window of an aerospace industry, and a vacuum chuck for fixing a wafer of a semiconductor industry.

* * * * *